United States Patent
Tung et al.

(10) Patent No.: US 10,656,193 B2
(45) Date of Patent: May 19, 2020

(54) ELECTROSTATIC DETECTING SYSTEM AND METHOD

(71) Applicant: Industrial Technology Research Institute, Hsinchu (TW)

(72) Inventors: Mean-Jue Tung, Kinmen County (TW); Shi-Yuan Tong, Hsinchu County (TW); Yu-Ting Huang, Hsinchu (TW); Ming-Da Yang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/393,271

(22) Filed: Dec. 29, 2016

(65) Prior Publication Data

US 2018/0172748 A1 Jun. 21, 2018

(30) Foreign Application Priority Data

Dec. 21, 2016 (TW) .............................. 105142347 A

(51) Int. Cl.
*G01R 29/12* (2006.01)
*H01L 21/67* (2006.01)

(52) U.S. Cl.
CPC ........ *G01R 29/12* (2013.01); *H01L 21/67253* (2013.01); *H01L 21/67288* (2013.01)

(58) Field of Classification Search
CPC .......................... G01R 29/12; H01L 21/67288
See application file for complete search history.

(56) References Cited

U.S. PATENT DOCUMENTS

| 4,625,176 A | 11/1986 | Champion et al. |
| 5,140,272 A | 8/1992 | Nishimatsu et al. |
| 5,594,222 A * | 1/1997 | Caldwell .............. H03K 17/955 200/600 |

(Continued)

FOREIGN PATENT DOCUMENTS

| CN | 1912639 | 2/2007 |
| CN | 1920584 | 2/2007 |

(Continued)

OTHER PUBLICATIONS

C.J. Harland et al., "Remote detection of human electroencephalograms using ultrahigh input impedance electric potential sensors," Applied Physics Letters 81(17), Oct. 21, 2002, pp. 3284-3286.

(Continued)

*Primary Examiner* — Akm Zakaria
(74) *Attorney, Agent, or Firm* — JCIPRNET

(57) ABSTRACT

An electrostatic detecting system and an electrostatic detecting method for detecting the static electricity generated at an active surface of a substrate are provided. The electrostatic detecting system includes a sensing apparatus and a signal processing apparatus. The sensing apparatus is disposed at least adjacent to a back surface opposite to the active surface of the substrate, for measuring the static electricity generated at the active surface and generating an initial electric signal. The signal processing apparatus is electrically connected to the sensing apparatus, for receiving the initial electric signal and correcting the initial electric signal based on a voltage compensation value to obtain a final electric signal.

16 Claims, 4 Drawing Sheets

(56) References Cited

U.S. PATENT DOCUMENTS

| | | | | |
|---|---|---|---|---|
| 6,490,920 | B1* | 12/2002 | Netzer | G01C 9/06 324/687 |
| 7,098,644 | B1* | 8/2006 | Denison | G01R 29/12 324/458 |
| 2003/0080744 | A1* | 5/2003 | Goldfine | G01V 3/088 324/345 |
| 2005/0110478 | A1 | 5/2005 | Shi | |
| 2007/0146621 | A1 | 6/2007 | Yeom | |
| 2011/0241702 | A1* | 10/2011 | Berkcan | G01R 29/12 324/633 |
| 2014/0139232 | A1* | 5/2014 | Ahn | G01R 29/12 324/452 |
| 2016/0103359 | A1* | 4/2016 | Kimura | G02B 5/201 349/33 |
| 2016/0116518 | A1 | 4/2016 | Wang et al. | |
| 2016/0188053 | A1 | 6/2016 | Wang et al. | |

FOREIGN PATENT DOCUMENTS

| | | |
|---|---|---|
| CN | 101685119 | 3/2010 |
| CN | 102175932 | 9/2011 |
| CN | 103221831 | 7/2013 |
| CN | 103713201 | 4/2014 |
| CN | 103839848 | 6/2014 |
| CN | 103713201 | 11/2014 |
| CN | 204214954 | 3/2015 |
| CN | 105158945 | 12/2015 |
| CN | 105308669 | 2/2016 |
| CN | 105431744 | 3/2016 |
| CN | 106019655 | 10/2016 |
| JP | H01314977 | 12/1989 |
| JP | H111211770 | 8/1999 |
| TW | 200427997 | 12/2004 |
| TW | I302986 | 11/2008 |
| TW | M445182 | 1/2013 |
| TW | I455224 | 10/2014 |
| TW | 201531717 | 8/2015 |
| TW | 201627678 | 8/2016 |
| WO | 2014203711 | 12/2014 |

OTHER PUBLICATIONS

Ken-Ichi Nomura et al., "A flexible proximity sensor formed by duplex screen/screen-offset printing and its application to non-contact detection of human breathing," Scientific Reports 6(19947), 2016, pp. 1-12.

Chuanlong Xu et al., "Sensing characteristics of electrostatic inductive sensor for flow parameters measurement of pneumatically conveyed particles", Journal of Electrostatics 65, 2007, pp. 582-592.

M. F. Rahmat et al., "Sensing and filtering characteristics of electrostatic sensors for pneumatically conveyed particles," International Journal of the Physical Sciences 6(22), Oct. 2, 2011, pp. 5091-5103.

Teimour Tajdari et al., "Review of Electrostatic Sensor Applications," Jurnal Teknologi (Sciences & Engineering) 70(3), 2014, pp. 7-12.

"Office Action of Taiwan Counterpart Application", dated Apr. 5, 2017, p. 1-p. 4, in which the listed references were cited.

Feng Li-Na, "Research and Application of Electrostatic Detection Technique." Nanjing University of Aeronautics and Astronautics The Graduate School College of Civil Aviation, Feb. 2009, pp. 1-60.

Hao Yin, et al., "Practical research of none-contact electrostatic detector." Chinachuyun, vol. 11, Dec. 31, 2013, pp. 110-111.

"Office Action of China Counterpart Application," dated Nov. 4, 2019, p. 1-p. 8.

* cited by examiner

ELECTROSTATIC DETECTING SYSTEM AND METHOD

CROSS-REFERENCE TO RELATED APPLICATION

This application claims the priority benefit of Taiwan application serial no. 105142347, filed on Dec. 21, 2016. The entirety of the above-mentioned patent application is hereby incorporated by reference herein and made a part of this specification.

TECHNICAL FIELD

The technical field relates to an electrostatic detecting system and an electrostatic detecting method.

BACKGROUND

In the current semiconductor fabrication processes, a substrate is generally transported between different processing stations by a substrate transportation apparatus (e.g., a robotic arm, a conveyor belt or the like). However, during the transportation, a friction at an interface between the substrate and the substrate transportation apparatus results in electrostatic charge accumulation, which is likely to damage the devices on the substrate. In addition, during a process (e.g., film peeling process) of removing a film on the substrate or a process (e.g., film attaching process) of attaching a film to the substrate, a large amount of static electricity is generated, which also causes damage to the devices on the substrate.

To detect the static electricity generated at the substrate, currently, in most cases, an electrostatic detecting apparatus is disposed in a path along which the substrate is transported, thereby performing detection on the passing substrate. However, such detecting apparatus is always located in a fixed position and performs single-point detection from above an active surface of the substrate, thus failing to effectively and accurately detect a position where the static electricity occurs, and also failing to perform real-time detection on the substrate.

In addition, with respect to the substrate during the film peeling process or the film attaching process, due to the smaller processing space, the electrostatic detection cannot be performed from above the active surface of the substrate during the film peeling process or film attaching process.

SUMMARY

The electrostatic detecting system of the disclosure includes a sensing apparatus and a signal processing apparatus. The electrostatic detecting system is adapted to detect static electricity generated at the active surface of the substrate. The sensing apparatus is disposed at least adjacent to the back surface opposite to the active surface of the substrate, for measuring the static electricity generated at the active surface and generating an initial electric signal. The signal processing apparatus is electrically connected to the sensing apparatus, for receiving the initial electric signal and correcting the initial electric signal based on a voltage compensation value to obtain a final electric signal.

The electrostatic detecting method of the disclosure includes the following steps. A sensing apparatus is disposed at least adjacent to a back surface opposite to an active surface of a substrate. By the sensing apparatus, static electricity generated at the active surface is measured and an initial electric signal is generated. By a signal processing apparatus, the initial electric signal is received and is corrected based on a voltage compensation value, so as to obtain a final electric signal.

Several exemplary embodiments accompanied with figures are described in detail below to further describe the disclosure in details.

DETAILED DESCRIPTION OF DISCLOSED EMBODIMENTS

Figure 1:
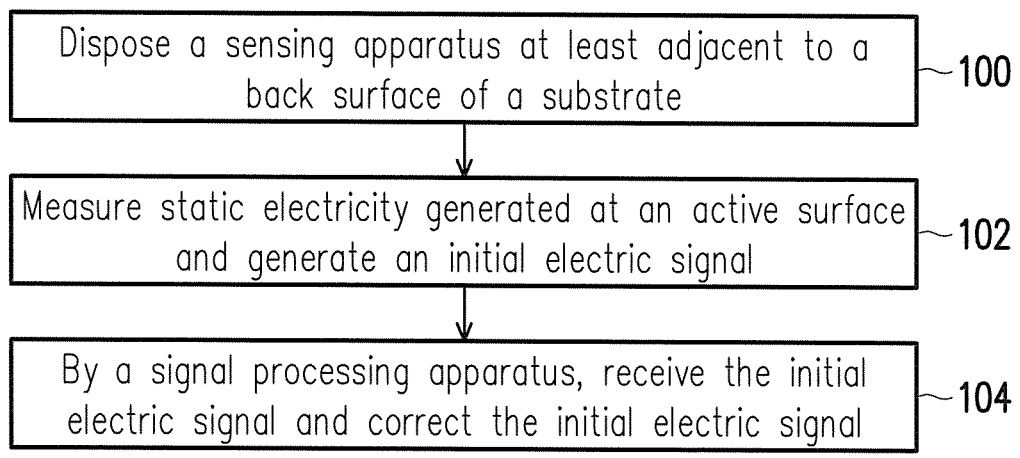
FIG. 1 is a flowchart of an electrostatic detecting method according to embodiments of the disclosure.

In the following detailed description, for the purposes of explanation, numerous specific details are set forth in order to provide a thorough understanding of the disclosed embodiments. It will be apparent, however, that one or more embodiments may be practiced without these specific details. In other instances, the well-known structures and devices are schematically shown in order to simplify the drawing.

In the following embodiments, by an electrostatic detecting system of the disclosure, static electricity generated at an active surface of a substrate can be detected from a back surface (a surface opposite to the active surface). Thus, a problem that the real-time detection fails owning to small processing space can be effectively solved. In addition, the electrostatic detecting system of the disclosure performs electrostatic detection with respect to the substrate in real time, thus effectively avoiding damage to the devices on the substrate caused by generation of static electricity.

Figure 2:
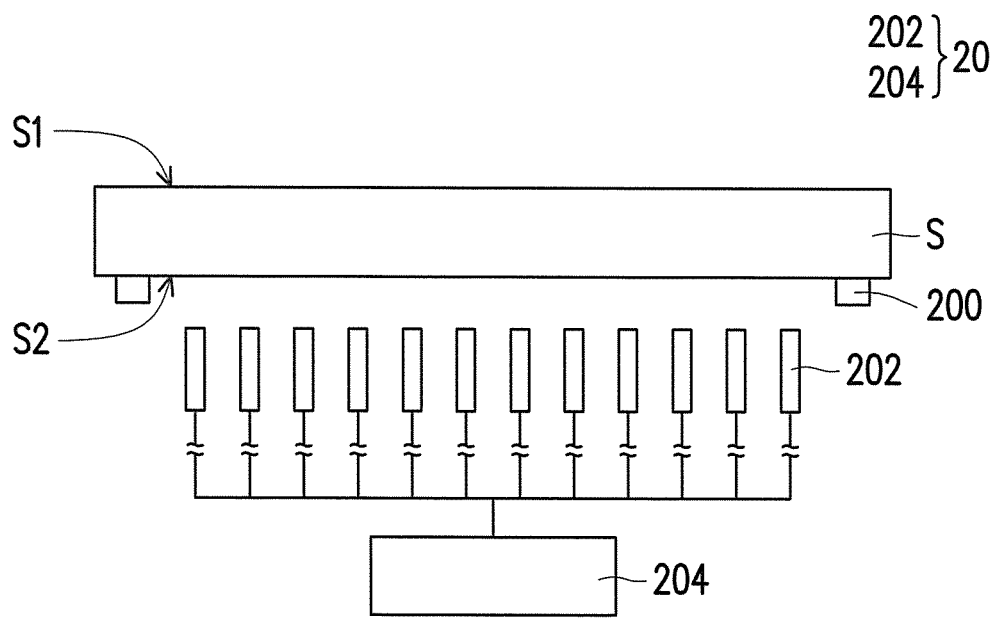
FIG. 2 is a schematic view of an electrostatic detecting system according to an embodiment of the disclosure.
Figure 3:
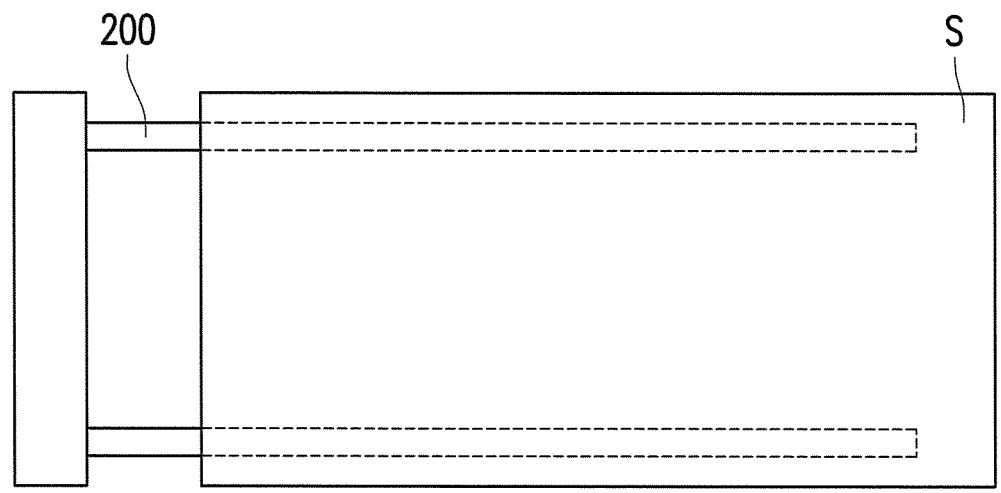
FIG. 3 is a schematic top view of a substrate and a substrate carrying apparatus in FIG. 2.

FIG. 1 is a flowchart of an electrostatic detecting method according to embodiments of the disclosure. FIG. 2 is a schematic view of an electrostatic detecting system according to an embodiment of the disclosure. FIG. 3 is a schematic top view of a substrate and a substrate carrying apparatus in FIG. 2. Referring to FIG. 1, FIG. 2 and FIG. 3 together, in the present embodiment, an electrostatic detecting system 20 performs electrostatic detection with respect to a substrate S. The substrate S may be any substrate, such as a silicon substrate, a glass substrate, or a plastic substrate, used in various fabrication processes. The substrate S has an active surface S1 and a back surface S2 opposite to each other. The active surface S1 is a surface on which a device is to be formed or has been formed. In the present embodiment, the substrate S is located on a substrate carrying apparatus (a robotic arm 200 or a conveyor belt), so that the substrate S can be transported between different processing stations. The robotic arm 200 supports the substrate S by support arms respectively located at two edges of the back surface S2 of the substrate S. When the robotic arm 200 contacts or is separated from the substrate S, or when the substrate S is subjected to a film peeling process or a film attaching process, static electricity is generated. In this way, the devices formed on the active surface may be damaged by the static electricity.

The electrostatic detecting system 20 includes a sensing apparatus 202 and a signal processing apparatus 204. In step 100, the sensing apparatus 202 is disposed adjacent to the back surface S2 of the substrate S. In the present embodiment, the sensing apparatus 202 is a plurality of sensing devices arranged in an array (e.g., a one-dimensional array or a two-dimensional array). The sensing device may be a well-known sensing device for sensing static electricity and generating an electric signal. Examples thereof include a metal electrode, a dielectric layer or a combination thereof. The metal electrode includes copper, silver, platinum, palladium, graphite, titanium, carbon black, iron, cobalt, nickel or a combination thereof; the dielectric layer includes barium titanate, strontium titanate, lead titanate, lead zirconate titanate or a combination thereof. However, the disclosure is not limited thereto. As shown in FIG. 2, the sensing apparatus 202 is disposed adjacent to the back surface S2 of the substrate S, and is disposed at a distance of, for example, 10 cm or less, or 5 cm or less, from the back surface S2, so as to effectively improve strength of a measured sensing signal. The sensing apparatus 202 is configured to measure, from the back surface S2 of the substrate S, the static electricity generated at the active surface S1 of the substrate S, and generate an initial electric signal. In the present embodiment, the initial electric signal is, for example, a voltage signal. In other embodiments, the sensing apparatus 202 may be disposed on the substrate carrying apparatus (the robotic arm 200 or the conveyor belt) and be moved therewith. The disclosure is not limited thereto.

In FIG. 2, the sensing apparatus 202 is, for example, a plurality of sensing devices arranged in an array, and these sensing devices are distributed almost all over the substrate S except for an area of the substrate S in contact with the robotic arm 200. In this way, the sensing apparatus 202 is capable of measuring static electricity generated at almost all positions on the active surface, and is therefore capable of more accurately determining a position where the static electricity is generated. However, the disclosure is not limited thereto. In other embodiments, these sensing devices may be arranged in other arbitrary manners. In addition, the sensing apparatus 202 may also be one sensing device. In a case where an arrangement area of the sensing device occupies a small portion of the substrate S, based on past experience, the sensing device is disposed corresponding to a position where static electricity is more often generated.

The signal processing apparatus 204 is electrically connected to the sensing apparatus 202, for receiving the initial electric signal generated by the sensing apparatus 202 and correcting the initial electric signal to obtain a final electric signal. The details thereof are described later.

Next, in step 102, the static electricity generated at the active surface S1 of the substrate S is measured using the sensing apparatus 202 disposed adjacent to the back surface S2 of the substrate S. Since the measured static electricity is the static electricity generated at the active surface S1, compared to a case where the static electricity is measured from the active surface S1, a difference value is present in an electric signal obtained by measuring from the back surface S2. Therefore, in subsequent steps, the signal processing apparatus 204 will be used to correct this electric signal, so as to obtain an electric signal similar to that obtained by measuring from the active surface S1. It should be noted that, according to actual needs, the distance between the sensing apparatus 202 and the back surface S2 may be adjusted, and difference in the electric signal caused by the distance may be corrected by the signal processing apparatus 204.

Then, in step 104, the signal processing apparatus 204 receives the electric signal generated by the sensing apparatus 202, and corrects the electric signal. In detail, the signal processing apparatus 204 is electrically connected to the sensing apparatus 202. After the sensing apparatus 202 measures the static electricity and generates the electric signal (initial electric signal), the signal processing apparatus 204 receives the initial electric signal. Then, the signal processing apparatus 204 corrects the initial electric signal through a processor according to data in a pre-established database, so as to obtain the final electric signal sufficiently reflecting the static electricity generated at the active surface S1 of the substrate S. For example, after receiving the initial electric signal, the signal processing apparatus 204 performs correction by adding a voltage compensation value to the initial electric signal (voltage signal). The voltage compensation value is generally determined by a thickness of the substrate S, a dielectric constant of the substrate S, and the distance between the sensing apparatus 202 and the back surface S2. However, the disclosure is not limited thereto. In other embodiments, the signal processing apparatus 204 may correct the initial electric signal by other methods.

Figure 6:
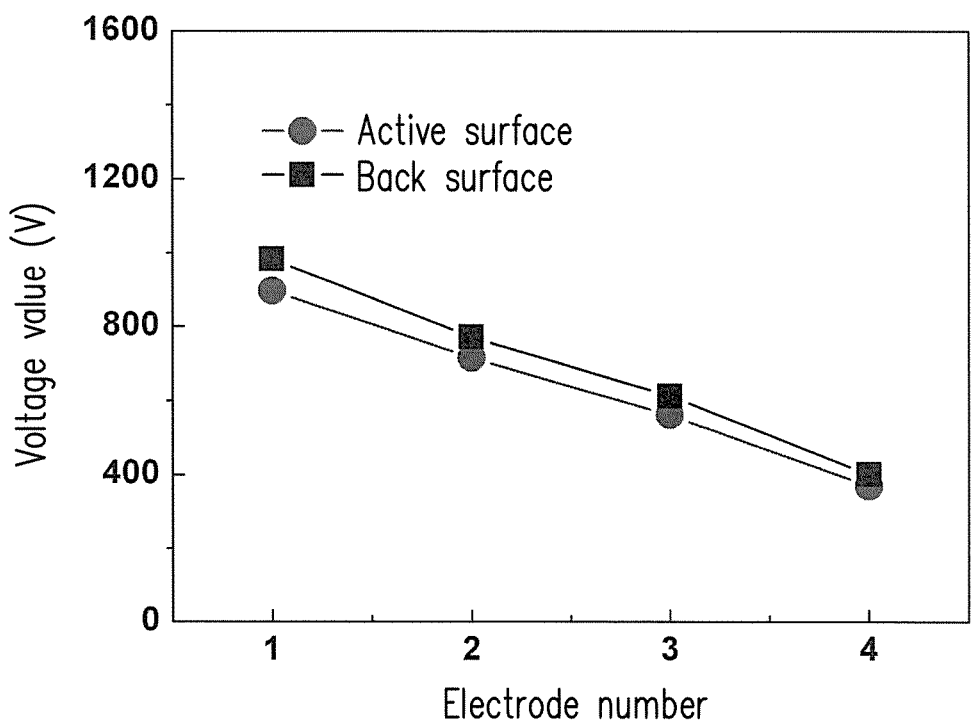
FIG. 6 illustrates results of electrostatic detection performed respectively from an active surface and a back surface of a substrate.
Figure 7:
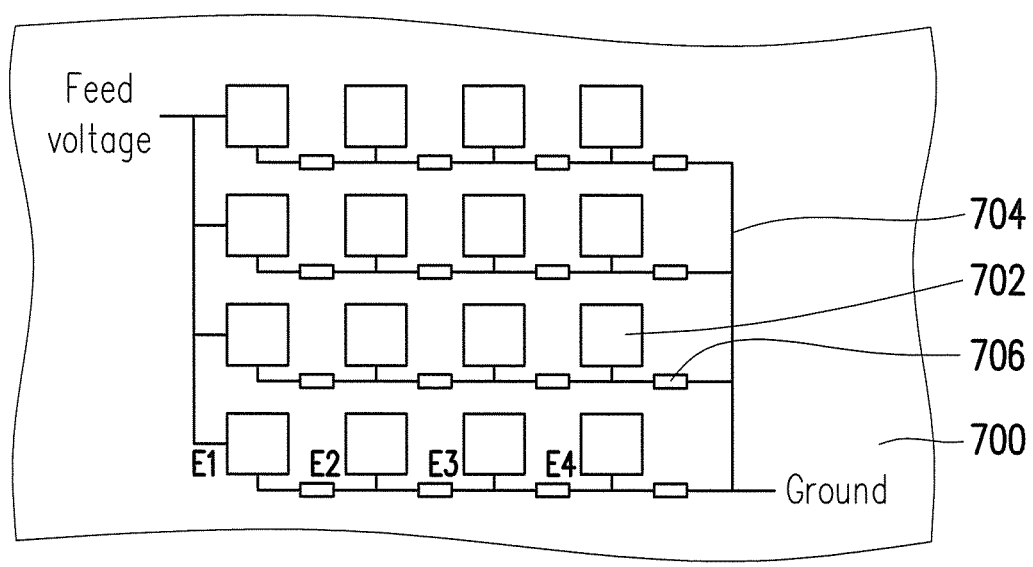
FIG. 7 is a schematic top view of a substrate for verifying the static electricity detecting method of the disclosure.

Hereinafter, accuracy of an electrostatic detecting method of the disclosure is verified by an experimental example. In the present experiment example, a glass substrate having a dielectric constant of 4.4 and a thickness of 1 mm was employed. As shown in FIG. 7, a plurality of electrodes 702 having a size of 10 mm×10 mm were provided on an active surface of a glass substrate 700. Each of the electrodes 702 was connected to one another by a circuit 704 and a resistor 706, and a voltage was applied to a voltage feed point by a feed voltage source of 1000 V. In this way, a voltage distribution was formed by the electrodes 702. In addition, the same sensing apparatus (e.g., a sensing apparatus having a sensing portion made of a metal copper electrode and a barium titanate composite dielectric layer) was used to measure static electricity generated at the active surface of the glass substrate 700 from a position of 25 mm above the active surface and from a position of 25 mm below a back surface (opposite to the active surface) of the glass substrate 700, respectively. The measurement results are as shown in FIG. 6. It is clear from FIG. 6 that, voltage values at four (numbered as E1, E2, E3 and E4 respectively) of the electrodes 702 that were measured from the back surface and corrected by a signal processing apparatus were approximately the same as the voltage values measured from the active surface. The signal processing apparatus corrected the measured voltage values in a manner based on factors such as substrate size, dielectric constant, distance and so on and derived from basic electric field theories. Therefore, the electrostatic detecting method of the disclosure indeed accurately detects static electricity generated at the active surface of the substrate.

In addition, in the electrostatic detecting system of the disclosure, the sensing apparatus is disposed at least adjacent to the back surface of the substrate rather than being disposed above the active surface of the substrate to perform static electricity measurement when the substrate passes by. Therefore, a real-time monitoring of a static electricity path is realized. In addition, since the sensing apparatus is disposed at least adjacent to the back surface of the substrate, in a case where electrostatic measurement cannot be performed from above the active surface of the substrate owning to smaller processing space, the static electricity generated at the active surface of the substrate can still be effectively detected.

Figure 4:
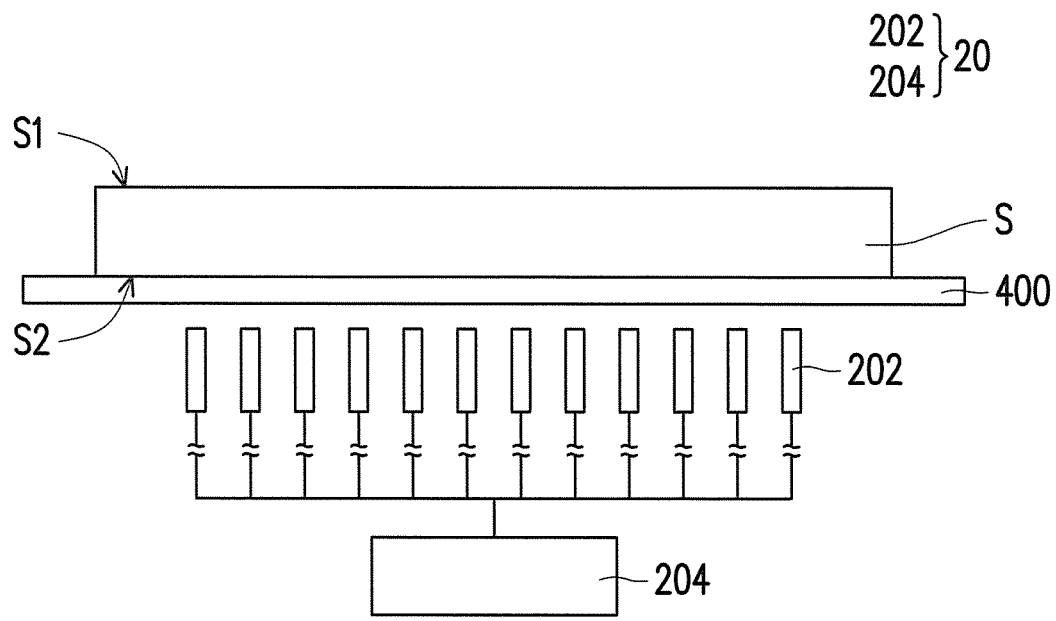
FIG. 4 is a schematic view of the electrostatic detecting system according to another embodiment of the disclosure.

In the above embodiments, the substrate S is located on the robotic arm 200. In other embodiments, for example, during a film peeling process or a film attaching process, the substrate S may be located on a support stage 400. As shown in FIG. 4, the back surface S2 of the substrate S is disposed on the support stage 400. At this moment, the sensing apparatus 202 is disposed below the support stage 400 (i.e., the support stage 400 is located between the back surface S2 and the sensing apparatus 202), and measures, from the back surface S2, the static electricity generated at the active surface S1. In the present embodiment, since the support stage 400 is present between the sensing apparatus 202 and the substrate S, the signal processing apparatus 204, when correcting the initial electric signal, incorporates a parameter (such as thickness, dielectric constant or the like) relating to the support stage 400 into calculation so as to obtain a compensation value.

Figure 5:
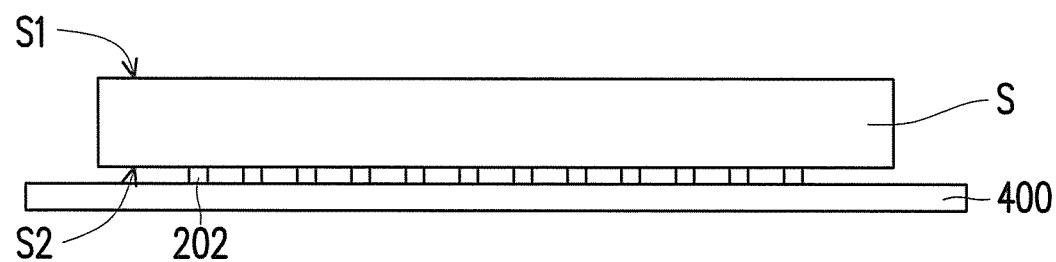
FIG. 5 is a schematic view of the electrostatic detecting system according to another embodiment of the disclosure.

FIG. 5 is a schematic view of the electrostatic detecting system according to another embodiment of the disclosure. Referring to FIG. 5, in the present embodiment, the back surface S2 of the substrate S is disposed on the support stage 400, and the sensing apparatus 202 is disposed between the substrate S and the support stage 400. In this case, during measurement of the static electricity generated at the active surface S1 from the back surface S2, since the support stage 400 is not present between the sensing apparatus 202 and the substrate S, the signal processing apparatus 204 does not incorporate the parameter relating to the support stage 400 into calculation when correcting the initial electric signal.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electrostatic detecting system adapted to detect static electricity generated at an active surface of a substrate on which device is formed, the electrostatic detecting system comprising:
    a sensing apparatus, disposed at least adjacent to a back surface opposite to the active surface of the substrate, for measuring the static electricity generated at the active surface and generating an initial electric signal; and
    a signal processing apparatus, electrically connected to the sensing apparatus, for receiving the initial electric signal and correcting the initial electric signal based on a voltage compensation value to obtain a final electric signal so as to compensate for a difference value present in the static electricity measured from the back surface and the active surface of the substrate, and outputting the final electric signal to obtain a voltage distribution on the active surface of the substrate,
    wherein the voltage compensation value is determined at least by a thickness and a dielectric constant of the substrate, and a distance between the sensing apparatus and the back surface.

2. The electrostatic detecting system according to claim 1, wherein the sensing apparatus contacts the back surface of the substrate.

3. The electrostatic detecting system according to claim 1, wherein the back surface of the substrate is disposed on a substrate carrying apparatus, and the sensing apparatus is located between the back surface and the substrate carrying apparatus.

4. The electrostatic detecting system according to claim 1, wherein the back surface of the substrate is disposed on a substrate carrying apparatus, and the substrate carrying apparatus is located between the back surface and the sensing apparatus.

5. The electrostatic detecting system according to claim 1, wherein the sensing apparatus comprises a plurality of sensing devices.

6. The electrostatic detecting system according to claim 5, wherein the sensing devices are arranged in an array.

7. The electrostatic detecting system according to claim 1, wherein the initial electric signal and the final electric signal are voltage signals.

8. The electrostatic detecting system according to claim 1, wherein a distance between the sensing apparatus and the back surface is 10 cm or less.

9. An electrostatic detecting method, comprising:
    disposing a sensing apparatus at least adjacent to a back surface opposite to an active surface of a substrate on which a device is formed;
    by the sensing apparatus, measuring static electricity generated at the active surface and generating an initial electric signal; and
    by a signal processing apparatus, receiving the initial electric signal and correcting the initial electric signal based on a voltage compensation value to obtain a final electric signal so as to compensate for a difference value present in the static electricity measured from the back surface and the active surface of the substrate, and outputting the final electric signal to obtain a voltage distribution on the active surface of the substrate,
    wherein the voltage compensation value is determined at least by a thickness and a dielectric constant of the substrate, and a distance between the sensing apparatus and the back surface.

10. The electrostatic detecting method according to claim 9, wherein the sensing apparatus contacts the back surface of the substrate.

11. The electrostatic detecting method according to claim 9, further comprising disposing the back surface of the substrate on a substrate carrying apparatus, wherein the sensing apparatus is located between the back surface and the substrate carrying apparatus.

12. The electrostatic detecting method according to claim 9, further comprising disposing the back surface of the substrate on a substrate carrying apparatus, wherein the substrate carrying apparatus is located between the back surface and the sensing apparatus.

13. The electrostatic detecting method according to claim 9, wherein the sensing apparatus comprises a plurality of sensing devices.

14. The electrostatic detecting method according to claim 13, wherein the sensing devices are arranged in an array.

15. The electrostatic detecting method according to claim 9, wherein the initial electric signal and the final electric signal are voltage signals.

16. The electrostatic detecting method according to claim 9, wherein a distance between the sensing apparatus and the back surface is 10 cm or less.

* * * * *